(12) United States Patent
Nakai

(10) Patent No.: US 6,809,755 B2
(45) Date of Patent: Oct. 26, 2004

(54) PATTERN WRITING APPARATUS, PATTERN WRITING METHOD AND SUBSTRATE

(75) Inventor: Kazuhiro Nakai, Kyoto (JP)

(73) Assignee: Dainippon Screen Mfg. Co., Ltd., Kyoto (JP)

(*) Notice: Subject to any disclaimer, the term of this patent is extended or adjusted under 35 U.S.C. 154(b) by 31 days.

(21) Appl. No.: 10/424,768

(22) Filed: Apr. 29, 2003

(65) Prior Publication Data

US 2003/0227536 A1 Dec. 11, 2003

(30) Foreign Application Priority Data

Jun. 6, 2002 (JP) .................................... P 2002-165120

(51) Int. Cl.[7] .......................... H01L 21/027; G03F 9/00; G03F 7/20; G03F 7/22; B41J 2/47
(52) U.S. Cl. ........................................ 347/248; 347/249
(58) Field of Search ................................ 347/248, 249, 347/234, 129, 132

(56) References Cited

U.S. PATENT DOCUMENTS 6,638,665 B2 * 10/2003 Kobinata ....................... 430/5

FOREIGN PATENT DOCUMENTS

JP 2001-264654 9/2001

* cited by examiner

Primary Examiner—Huan Tran
(74) Attorney, Agent, or Firm—McDermott Will & Emery LLP

(57) ABSTRACT

In a pattern writing apparatus for writing a plurality of pattern blocks of LSI chips which are arrayed on a substrate, provided are a rasterization part (312) for rasterizing LSI data 931, an expansion/contraction rate calculation part 313 for obtaining the expansion/contraction rate of a substrate (9) on the basis of an image from a camera (15a), a data correction part (314) for correcting raster data (932) in accordance with the expansion/contraction rate and a data generation part (315) for generating writing data on the basis of the corrected data. From the writing data generated by the data generation part (315), an array of pattern blocks in which the width of a non-pattern region between adjacent ones of the pattern blocks is changed while the width of each pattern block is maintained is written on the substrate.

18 Claims, 12 Drawing Sheets

PATTERN WRITING APPARATUS, PATTERN WRITING METHOD AND SUBSTRATE

BACKGROUND OF THE INVENTION

1. Field of the Invention

The present invention relates to a technique for writing a pattern by irradiating a substrate with a modulated light beam.

2. Description of the Background Art

Conventionally well known is an apparatus for writing a pattern on a printed circuit board on which a resist film is formed, by modulating a laser beam and emitting it to the board. For example, Japanese Patent Application Laid Open Gazette No. 2001-264654 discloses a laser writing apparatus that corrects scan control of laser beams in accordance with expansion or contraction of a printed circuit board to perform writing without the effect of expansion or contraction.

When the pattern writing apparatus for performing pattern writing with light is applied to writing on a semiconductor substrate, the amount of data which are generated for pattern writing is so large and it takes too much time to generate the data.

Further, when only one block of pattern (hereinafter, referred to as "pattern block") which is relatively coarse is written on a whole substrate, like in the case of a printed circuit board, an appropriate pattern can be written by uniformly expanding or contracting the pattern block in accordance with expansion or contraction of the substrate, but when a number of very fine pattern blocks are written, like in the case of a semiconductor substrate, if all the pattern blocks are uniformly expanded or contracted, there is a possibility that microscopic deviation may be caused in some of the very fine patterns by the effect of discretization in rasterization.

SUMMARY OF THE INVENTION

It is an object of the present invention to provide a technique for appropriately and easily writing a number of very fine pattern blocks on a substrate.

The present invention is intended for a pattern writing apparatus for performing pattern writing by irradiating a substrate with a light beam. The pattern writing apparatus comprises a light beam emission part for emitting a modulated light beam, a scanning mechanism for scanning an irradiation point of a light beam from the light beam emission part on a substrate, a writing data generation part for generating writing data, a writing control part for writing an array of a plurality of pattern blocks on a substrate by controlling the light beam emission part and the scanning mechanism on the basis of writing data, and a detector for detecting expansion or contraction of a substrate, and in the pattern writing apparatus, the writing data generation part generates writing data in which a width of each gap between adjacent ones of pattern blocks is changed on the basis of a detection result from the detector while a width of each of the plurality of pattern blocks is maintained in at least one direction.

According to an aspect of the present invention, the writing data generation part generates writing data in which widths of each gap between adjacent ones of pattern blocks are changed while widths of each of the plurality of pattern blocks are maintained in two directions orthogonal to each other.

It is thereby possible to appropriately write the pattern blocks without complicate control.

According to one preferred embodiment of the present invention, the scanning mechanism scans an irradiation point of a light beam in a main scan direction and a subscan direction and writing of stripe regions each extending in the subscan direction is repeated in the main scan direction, each unit region includes one of the plurality of pattern blocks, every edge on an end in the main scan direction of an unit region coincides with an edge of one of the stripe regions, and the writing data generation part divides each unit region into a plurality of divided regions each having a predetermined width in the main scan direction to obtain partial writing data on each of the plurality of divided regions.

Further, the writing data generation part corrects the partial writing data to data in which a width of a non-pattern region on an end in the subscan direction is changed on the basis of the detection result, and/or corrects partial writing data corresponding to a divided region on an end in the main scan direction to data in which a width of a non-pattern region on an end in the main scan direction is changed on the basis of the detection result.

It is thereby reduce the amount of computation for generating writing data.

The present invention is also intended for a pattern writing method for performing pattern writing by irradiating a substrate with a light beam, and a substrate on which a pattern is written by this pattern writing method.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
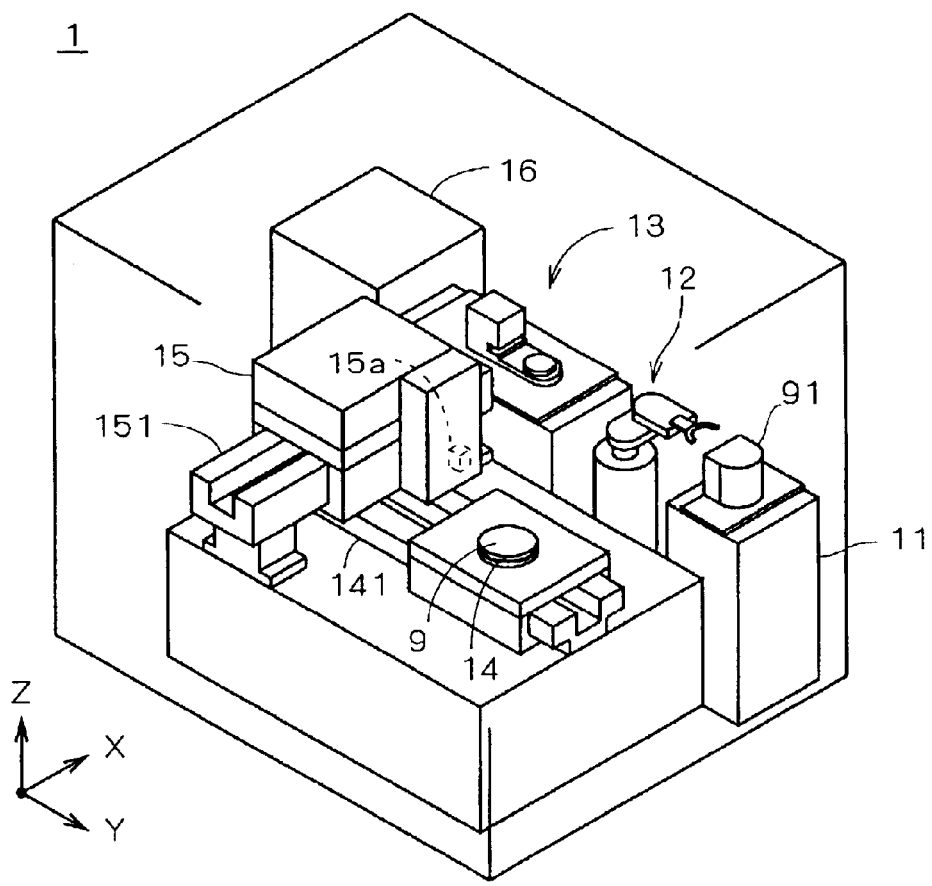
FIG. 1 is a perspective view showing a pattern writing apparatus.

FIG. 1 is a perspective view showing a pattern writing apparatus 1 in accordance with one preferred embodiment of the present invention. The pattern writing apparatus 1 is an apparatus which performs writing on a resist film over a semiconductor substrate (hereinafter, referred to as "substrate") 9 by irradiating the substrate 9 with a light beam, which is a bundle of modulated light beam elements, and comprises a cassette mount 11 on which a cassette 91 accommodating substrates 9 is mounted, a transfer robot 12 for taking a substrate 9 out from the cassette 91 and transferring the same, a prealignment part 13 for performing prealignment, a stage 14 on which a substrate 9 is mounted in writing and an irradiation head 15 for irradiating a substrate 9 with a laser beam.

The stage 14 is transferred by a stage transfer mechanism 141 in the Y direction of FIG. 1 (in a subscan direction of the light beam) and the irradiation head 15 is transferred by a head transfer mechanism 151 in the X direction (in a main scan direction of the light beam). Respective operations of the constituent elements in the pattern writing apparatus 1 are controlled by a control circuit in an electrical rack 16 and the electrical rack 16 is provided with a circuit for generating data required for pattern writing.

Figure 2:
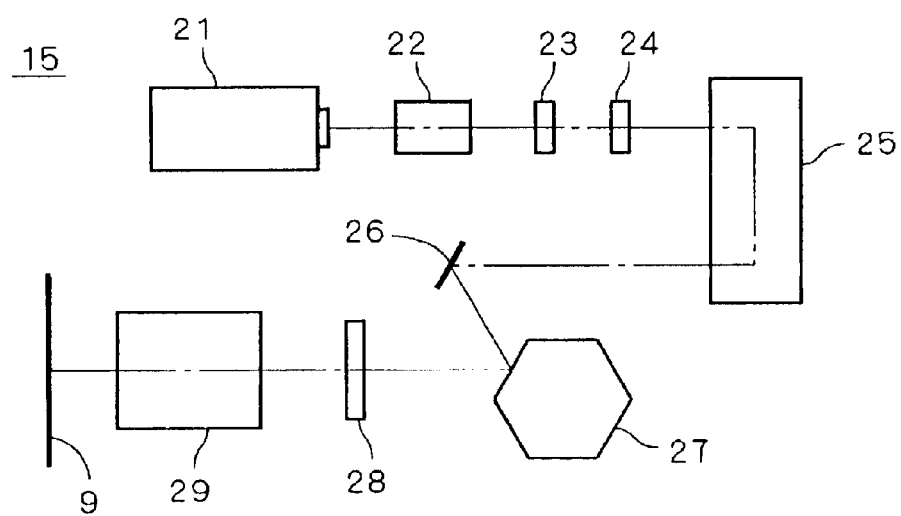
FIG. 2 is a view showing a main internal structure of an irradiation head.

FIG. 2 is a view showing a main internal structure of the irradiation head 15. In the irradiation head 15, a laser 21 serving as a light source, a beam expander 22, a beam splitter 23 and a multichannel acousto-optic modulator 24 (hereinafter, referred to as "AOM") are arranged in this order, and a plurality of laser light beam elements (i.e., multichannel light beam) from the beam splitter 23 are individually modulated by the acousto-optic modulator 24. A multichannel light beam from the acousto-optic modulator 24 is regulated by an optical unit 25 having various lenses and mirrors, reflected by a mirror 26 and guided to a polygon mirror 27.

The light beam deflected by the polygon mirror 27 is directed towards a direction ((−Z) direction of FIG. 1) orthogonal to the substrate 9 by a turnaround mirror 28 (also the course of the light beam from the turnaround mirror 28 is shown in the same plane in FIG. 2), and emitted to the substrate 9 through an optical unit 29 having a field lens and a cylindrical lens. A main scan of the light beam by the polygon mirror 27 corresponds to the X direction of FIG. 1.

Figure 3:
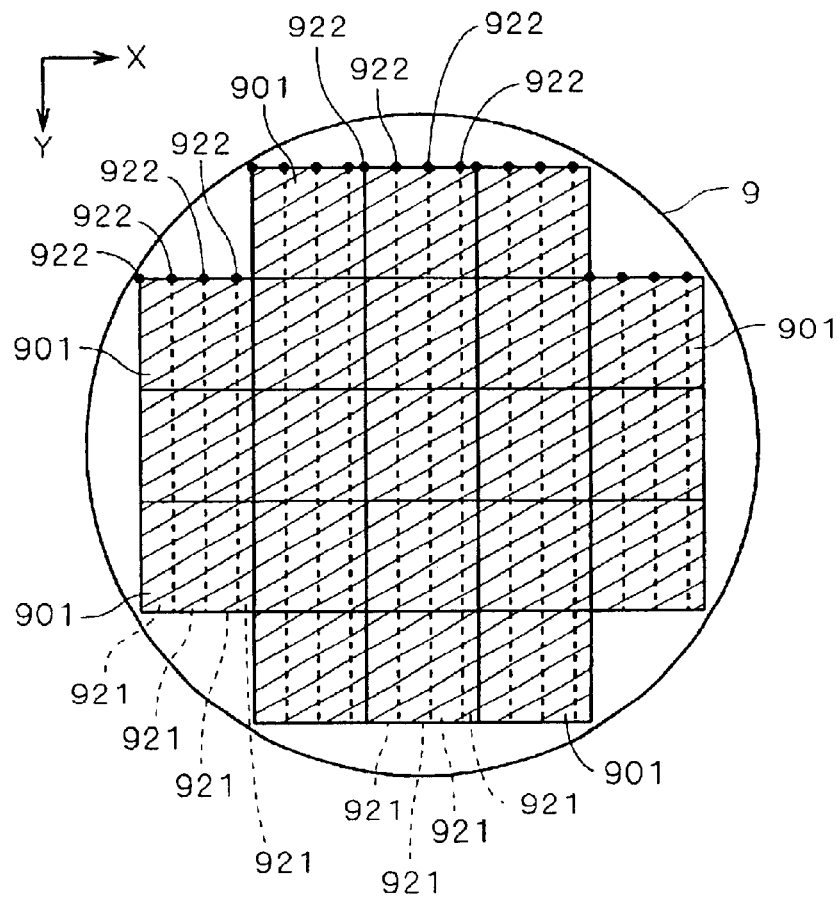
FIG. 3 is a view showing a substrate.
Figure 4:
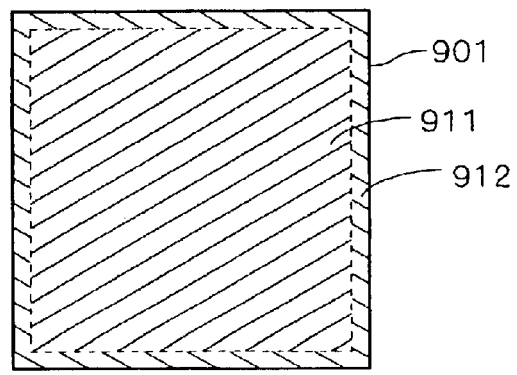
FIG. 4 is a view showing a unit region.

FIG. 3 is a view showing the substrate 9 on which a pattern is written through exposure by the pattern writing apparatus 1. On the substrate 9, a number of pattern blocks of dies corresponding to the LSI chips are written, being arrayed in a lattice arrangement in the X and Y directions orthogonal to each other. In FIG. 3, each region including one pattern block (which is a region as a unit for repeat of patterns, hereinafter referred to as "unit region") is represented by a reference sign 901. FIG. 4 is an enlarged view showing one unit region 901. One unit region 901 consists of a pattern block 911 and a non-pattern region 912 around the pattern block 911 as a margin. Therefore, a plurality of pattern blocks are arrayed on the substrate 9 with the non-pattern regions 912 therebetween.

Pattern writing is performed repeatedly in the main scan direction for each stripe region (hereinafter, referred to as "stripe") 921 extending in the Y direction (subscan direction) as shown in FIG. 3. The main scan of an irradiation point of the light beam by the polygon mirror 27 (see FIG. 2) is performed inside each stripe 921 in the X direction, and a subscan is performed by transferring the stage 14 by the stage transfer mechanism 141 in the Y direction (see FIG. 1). When writing for one stripe 921 is completed, the irradiation head 15 is transferred by the head transfer mechanism 151 in the main scan direction, to start writing of the next stripe 921.

The writing of a stripe 921 is started from a writing start position represented by a reference sign 922. Some writing start positions 922 are corner positions on the (−X) side and the (−Y) side in the unit regions 901 on the (−Y) side and positions away from this position by predetermined distances. In other words, writing start positions 922 are determined at specified positions in a unit region 901 and every edge on an end in the main scan direction of the unit region 901 coincides with an edge of one of the stripes 921. Therefore, each unit region 901 is divided equally by the stripes 921, and it is thereby possible to reduce the amount of computation required for generation of writing data as discussed later.

Figure 5:
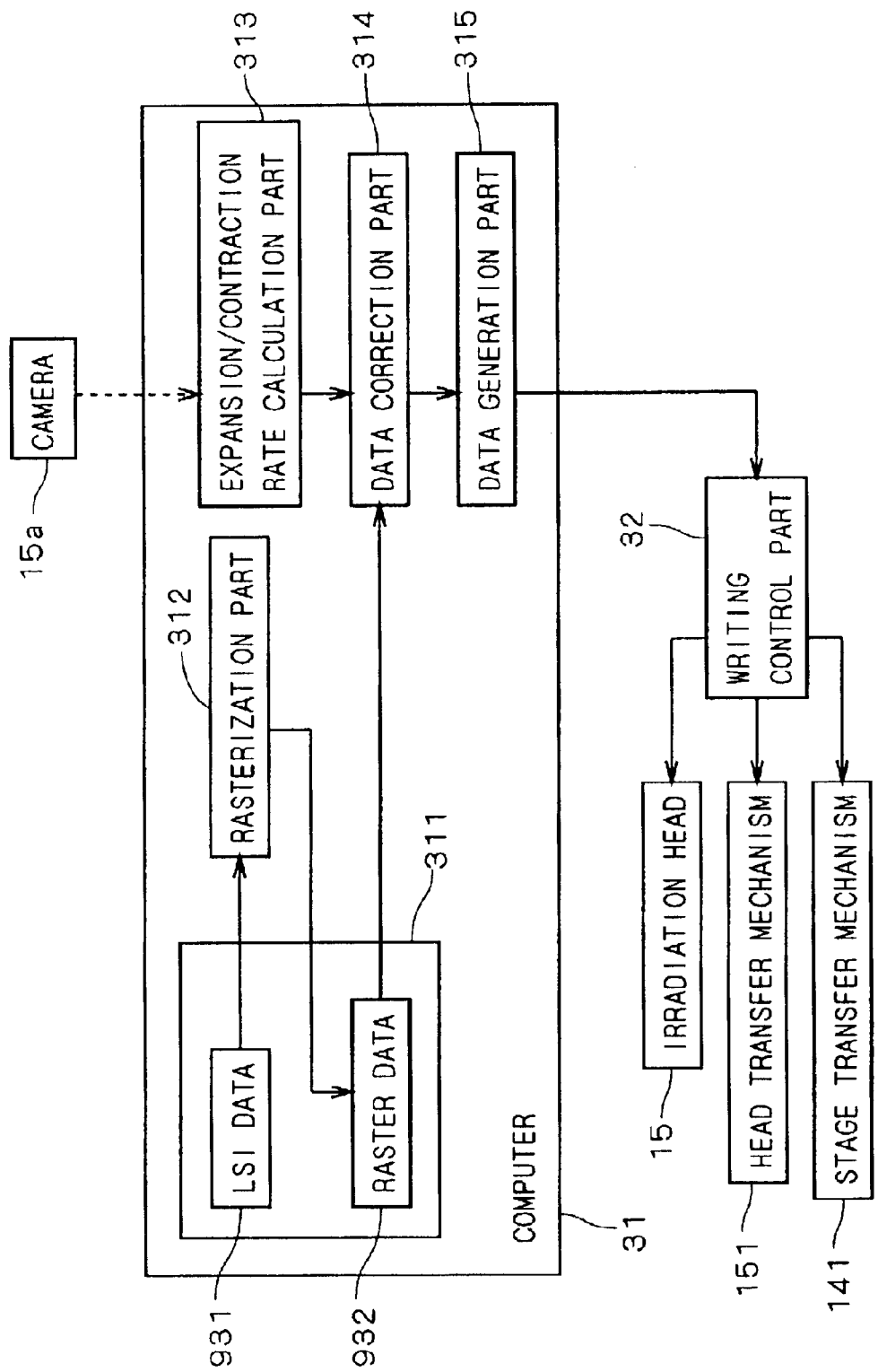
FIG. 5 is a block diagram showing a partial constitution of the pattern writing apparatus which relates to writing control.

FIG. 5 is a block diagram showing a partial constitution of the pattern writing apparatus 1 which relates to writing control. A computer 31 and a writing control part 32 are provided in the electrical rack 16 and a camera 15a is provided inside the irradiation head 15 to perform image pickup of alignment marks on the substrate 9 (see FIG. 1). The computer 31 has a CPU, a memory 311 and the like, and a rasterization part 312, an expansion/contraction rate calculation part 313, a data correction part 314 and a data generation part 315 are functions which are achieved by computation of the CPU in the computer 31 in accordance with a predetermined program. The writing control part 32 controls the irradiation head 15, the head transfer mechanism 151 and the stage transfer mechanism 141, to thereby perform writing of a plurality of pattern blocks 911.

Figure 6:
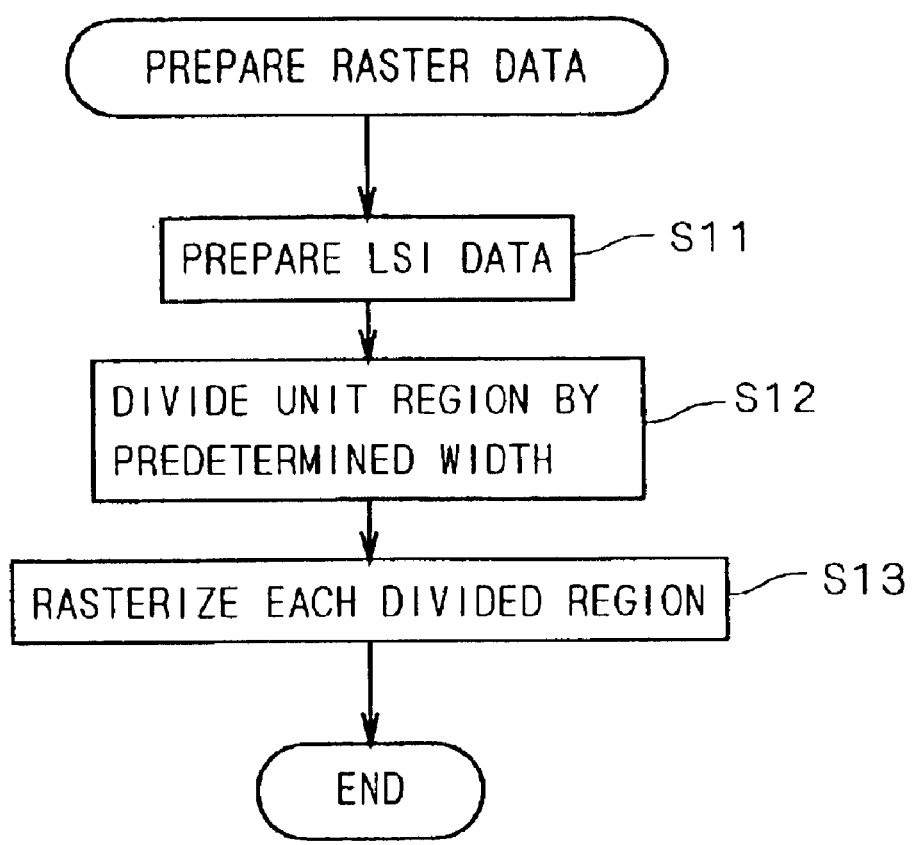
FIG. 6 is a flowchart showing an operation of the pattern writing apparatus in preparing raster data.
Figure 7:
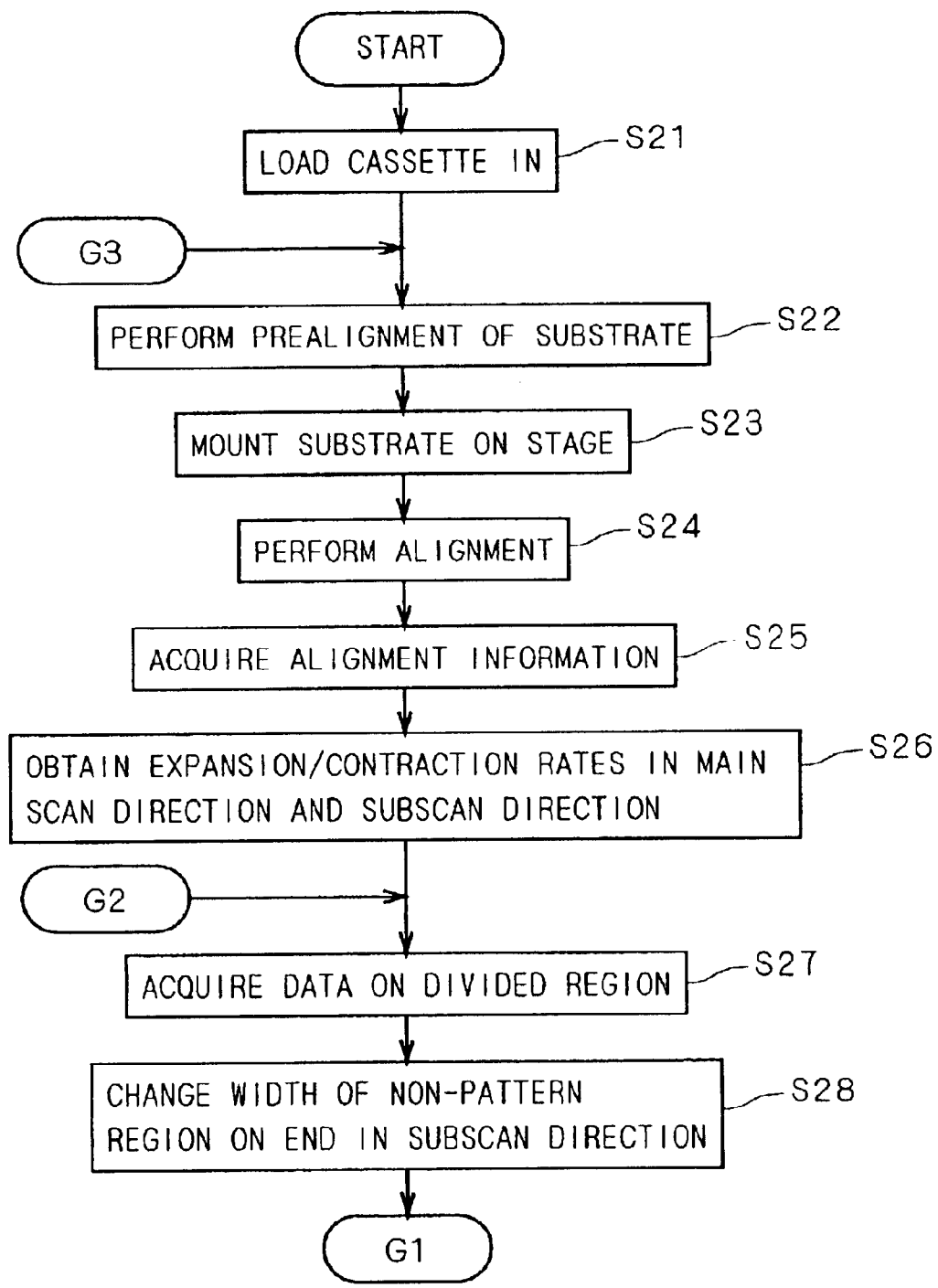
FIGS. 7 and 8 are flowcharts showing an operation of the pattern writing apparatus for performing pattern writing.
Figure 8:
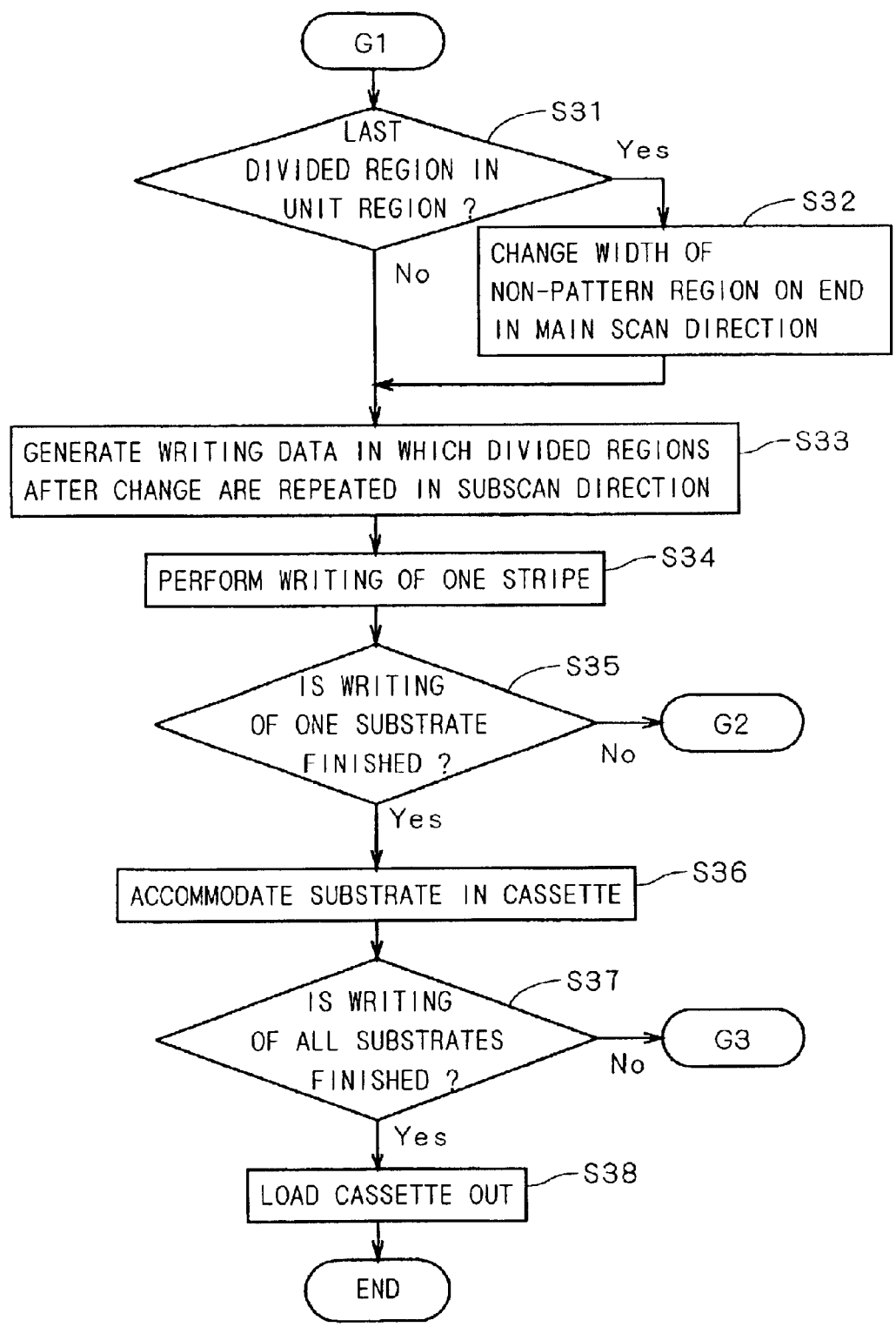

FIG. 6 is a flowchart showing an operation of the pattern writing apparatus 1 in preparing the raster data to be used for pattern writing, and FIGS. 7 and 8 are flowcharts showing an operation of the pattern writing apparatus 1 for performing pattern writing. Hereafter, referring to FIGS. 1 to 8, the operation of the pattern writing apparatus 1 will be discussed.

In the pattern writing apparatus 1 of FIGS. 5 and 6, first, image data (which is image data representing a unit region 901 including a pattern block 911, and may have any format such as vector format) corresponding to one LSI is prepared in the memory 311 as LSI data 931 (FIG. 6: Step S11). The LSI data 931 is data generated by external CAD system or the like. The rasterization part 312 performs rasterization by dividing the unit region 901 represented by the LSI data 931, to generate raster data 932 and store the data in the memory 311 (Steps S12 and S13).

Figure 9:
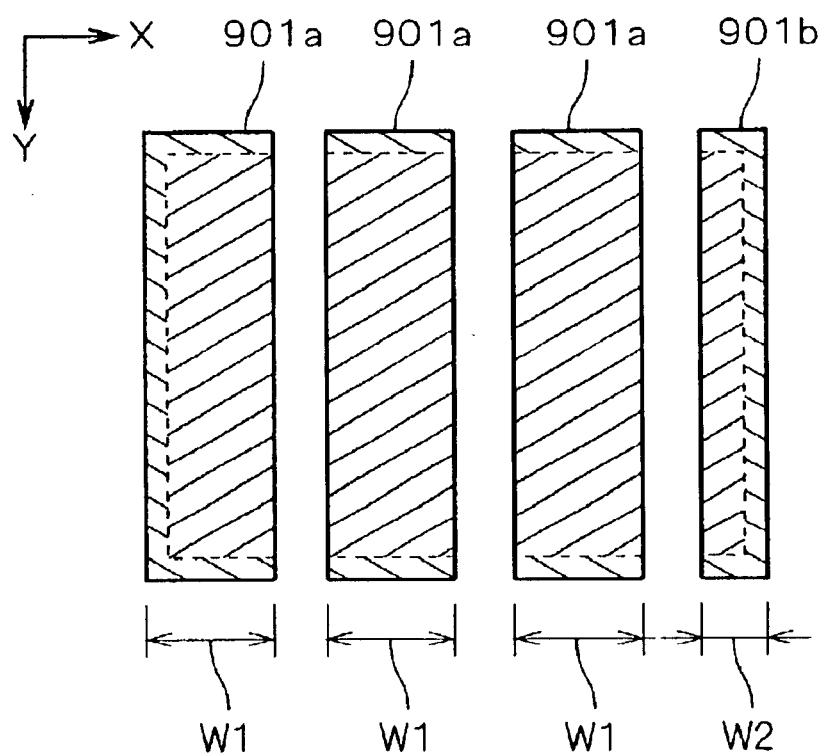
FIG. 9 is a view showing divided regions.

FIG. 9 is a view showing an operation by the rasterization part 312. The rasterization part 312 divides the unit region 901 represented by the LSI data 931 into divided regions 901a each having a predetermined width W1 in the main scan direction from the (−X) side (Step S12). The width W2 of a divided region 901b on the most (+X) side, however, is not larger than W1. Then, the rasterization part 312 rasterizes the divided regions 901a and 901b, to generate raster data 932 (partial writing data) on each divided region (Step S13).

When preparation of the raster data 932 is completed or in parallel to preparation of the raster data 932, the cassette 91 is loaded in the pattern writing apparatus 1 of FIG. 1 and put on the cassette mount 11 (FIG. 7: Step S21). The transfer robot 12 takes one substrate 9 out from the cassette 91 and transfers the substrate 9 to the prealignment part 13. The prealignment part 13 roughly determines the position of the substrate 9 through prealignment (Step S22), and the transfer robot 12 puts the substrate 9 on the stage 14 (Step S23).

After that, the alignment marks on the substrate 9 are sequentially positioned below the irradiation head 15 by the stage transfer mechanism 141 and the head transfer mechanism 151, and the camera 15a performs image pickup. The image data from the camera 15a is processed by an image processing circuit (not shown in FIG. 5) in the electrical rack 16, and the positions of the alignment marks on the stage 14 are precisely obtained. A rotation mechanism is provided on the stage 14 to slightly rotate the substrate 9 about an axis in the Z direction, and alignment (positioning) is performed by the rotation mechanism so that the substrate 9 may have an orientation suitable for pattern writing (Step S24).

The expansion/contraction rate calculation part 313 of FIG. 5 acquires the positions of the alignment marks on the substrate 9 and the amount of correction in orientation of the substrate 9 which are obtained by the image processing circuit (Step S25) and obtains the positions of the alignment marks after alignment, the expansion/contraction rates of the substrate 9 (i.e., the expansion/contraction rates of the main surface) in the main scan direction and the subscan direction (Step S26).

Figure 10:
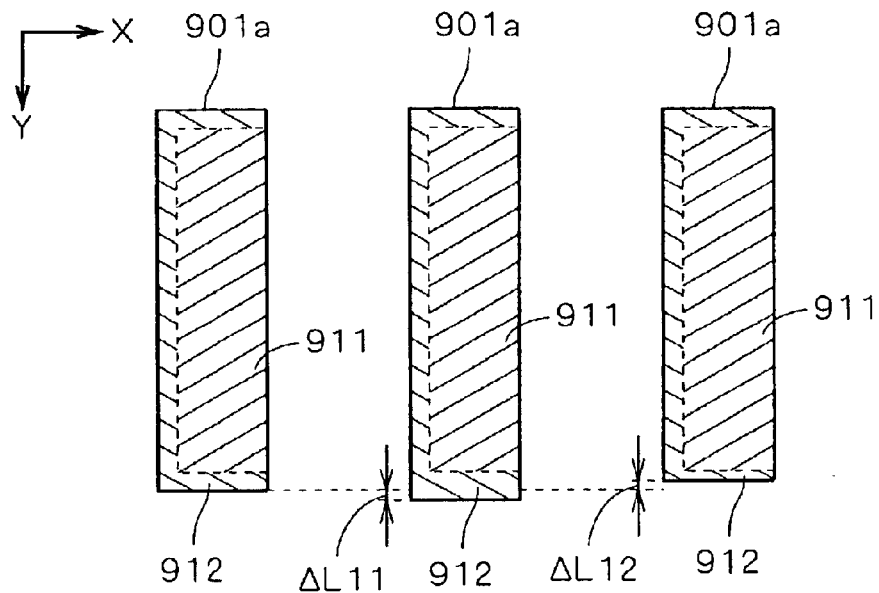
FIG. 10 is a view used for explanation of data correction by a data correction part.

On the other hand, the data correction part 314 acquires raster data 932 on the divided region 901a on the most (−X) side of FIG. 9 (Step S27), and corrects data on the basis of the expansion/contraction rate which is a result of detecting expansion or contraction (Step S28). FIG. 10 is a view used for explanation of data correction by the data correction part 314. In FIG. 10, the left divided region 901a represents a state before correction, the center divided region 901a corresponds to data after correction in the case of expansion of the substrate 9 in the subscan direction and the right divided region 901a corresponds to data after correction in the case of contraction of the substrate 9 in the subscan direction.

As can be seen from comparison between the left and center divided regions 901a, when the substrate 9 expands in the subscan direction, the width of the non-pattern region 912 (which is longer in the main scan direction) on the forward end in the subscan direction (on the (+Y) side) inside the divided region 901a increases while the shape of the pattern block 911 is maintained. As can be seen from comparison between the left and right divided regions 901a, when the substrate 9 contracts in the subscan direction, the width of the non-pattern region 912 on the forward end in the subscan direction decreases while the shape of the pattern block 911 is maintained. The amounts of change $\Delta L11$ and $\Delta L12$ in width of the non-pattern regions 912 can be each obtained by multiplying the length of the unit region 901 in the subscan direction by the expansion/contraction rate of the substrate 9 in the subscan direction.

Figure 11:
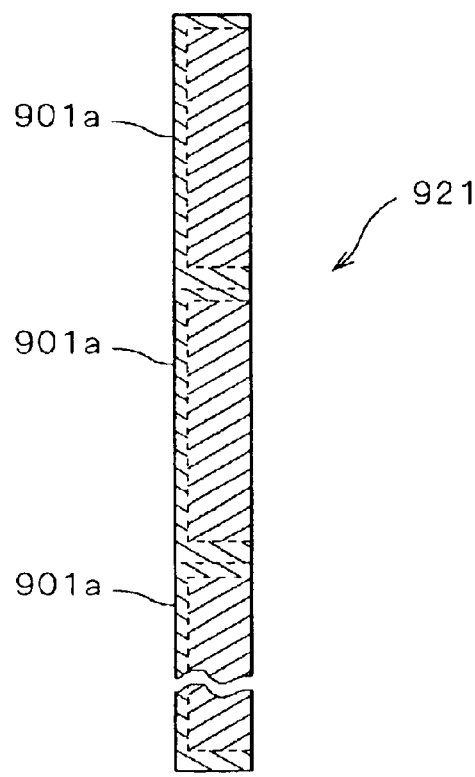
FIG. 11 is a view showing a stripe.

Next, when the data correction on one divided region 901a is completed, the corrected raster data 932 is transmitted to the data generation part 315. The data generation part 315 generates writing data which is obtained by repeating the changed divided regions 901a in the subscan direction as shown in FIG. 11, in other words, data which corresponds to one stripe 921 of FIG. 3 (Step S33). The writing data which is thus generated is transmitted from the data generation part 315 to the writing control part 32, and the writing control part 32 controls the irradiation head 15 and the stage transfer mechanism 141 to perform writing for one stripe (Step S34). In the data generation part 315, writing data having a format which includes a command to repeat writing on data of one divided region may be generated.

When writing for one stripe 921 is completed, the same operation is performed on the next divided region 901a in the main scan direction, and thus writing for each stripe 921 is performed in series (Step S35). Then, an operation on the divided region 901b on the most (+X) side of FIG. 9 is started, where the divided region 901b is acquired by the data correction part 314 (Step S27) and the width of the non-pattern region 912 on an end in the subscan direction is changed on the basis of the expansion/contraction rate of the substrate 9 in the subscan direction (Step S28). In the case of the last divided region 901b of the unit region 901, data correction for changing the width of the non-pattern region 912 on the forward end in the main scan direction (on the (+X) side) is further performed (Steps S31 and S32).

Figure 12:
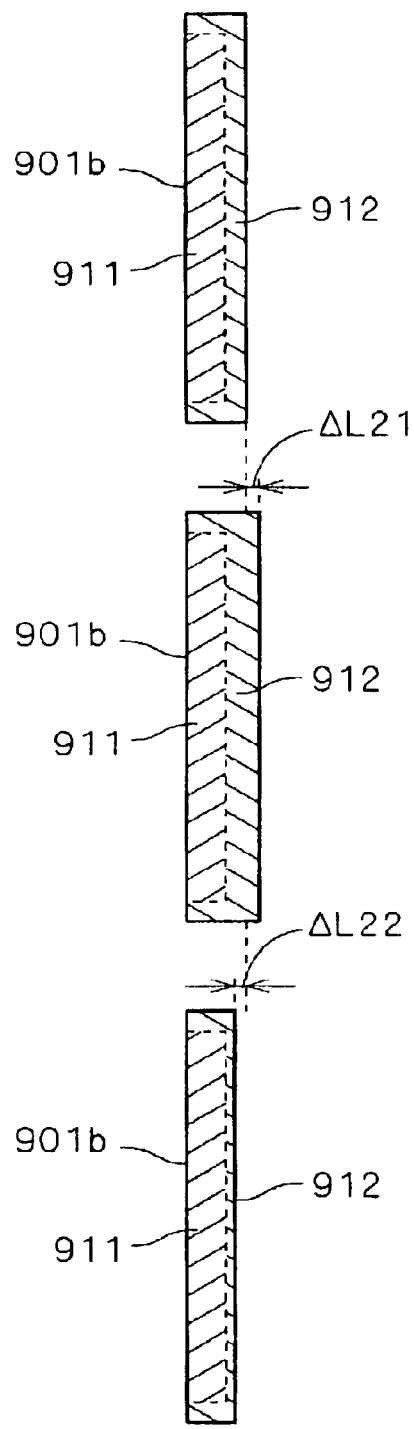
FIG. 12 is a view used for explanation of data correction by the data correction part.

FIG. 12 is a view used for explanation of change in width of the non-pattern region 912 (extending in the subscan direction) on the forward end in the main scan direction. In FIG. 12, the upper divided region 901b represents a state before correction, the center divided region 901b corresponds to data after correction in the case of expansion of the substrate 9 in the main scan direction and the lower divided region 901b corresponds to data after correction in the case of contraction of the substrate 9 in the main scan direction.

As can be seen from comparison between the upper and center divided regions 901b, when the substrate 9 expands in the main scan direction, the width of the non-pattern region 912 on the forward end in the main scan direction (on the (+X) side) inside the divided region 901b increases while the shape of the pattern block 911 is maintained. As can be seen from comparison between the upper and lower divided regions 901b, when the substrate 9 contracts in the main scan direction, the width of the non-pattern region 912 on the forward end in the main scan direction decreases while the shape of the pattern block 911 is maintained. The amounts of change $\Delta L21$ and $\Delta L22$ in width of the non-pattern regions 912 can be each obtained by multiplying the length of the unit region 901 in the main scan direction by the expansion/contraction rate of the substrate 9 in the main scan direction.

Figure 13:
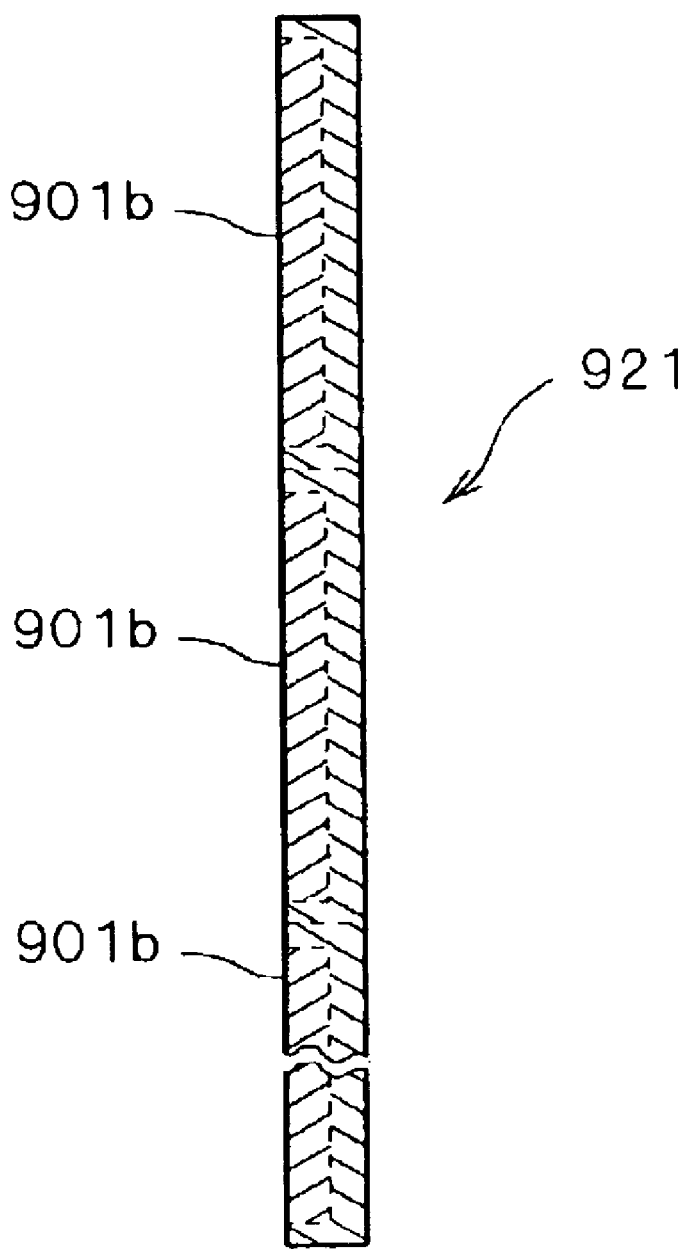
FIG. 13 is a view showing a stripe.

When the data corrections on the divided region 901b in the main scan direction and the subscan direction are completed, the corrected raster data 932 is transmitted to the data generation part 315, where writing data for one stripe 921 which is obtained by repeating the changed divided regions 901b in the subscan direction as shown in FIG. 13 is generated (Step S33). The writing data which is thus generated is transmitted from the data generation part 315 to the writing control part 32, where writing for one stripe 921 is performed (Step S34).

After that, the same operation is performed on a plurality of unit regions 901 arranged in the subscan direction adjacently to the stripe 921 corresponding to the divided region 901b (see FIG. 3), and thus writing on each stripe 921 on the substrate 9 is performed. When writing on all the stripes 921 on the substrate 9 is completed (Step S35), the substrate 9 is returned to the cassette 91 by the transfer robot 12 (Step S36), and the next substrate 9 is taken out and writing thereon is started (Step S37). When writing on all the substrates 9 accommodated in the cassette 91 is completed, the cassette 91 is loaded out from the pattern writing apparatus 1 (Step S38).

In the pattern writing apparatus 1 which has been discussed above, the expansion/contraction rates in the main scan direction and the subscan direction are detected on each substrate 9 and the widths of each non-pattern region 912 on an end in the main scan direction and on an end in the subscan direction (only the width on an end in the subscan direction for each divided region 901a) are changed. At this time, since the size of the pattern block 911 is maintained, the widths of each gap (more correctly, the width of each gap in the main scan direction and the width of each gap in the subscan direction) between adjacent pattern blocks can be changed while the widths of each pattern block 911 written on the substrate 9 are maintained in the main scan direction and the subscan direction.

Since the amount of expansion or contraction for one pattern block 911 on the substrate 9 is usually very small, by maintaining the widths of the pattern block 911 in the main scan and subscan directions, it is possible to achieve an appropriate writing. In other words, if writing of the pattern block 911 which expands or contracts in accordance with expansion or contraction of the substrate 9 is performed, there is a possibility that the pattern may be partially deformed due to discretization error in rasterization or scan control, but the pattern writing apparatus 1 does not raise such a problem.

In a case where the pattern written on the whole substrate 9 is extracted or contracted mechanically (i.e., by changing the transmission speed of the stage and the scan width of the light beam), like in the conventional case, a complex control is required, but in the pattern writing apparatus 1, since the size of the pattern block 911 is not changed, the control is easy.

In the pattern writing apparatus 1, since rasterization is performed only on data corresponding to one LSI, it is possible to remarkably reduce the time for data processing as compared with the case where the pattern written on the whole substrate 9 is rasterized.

Figure 14:
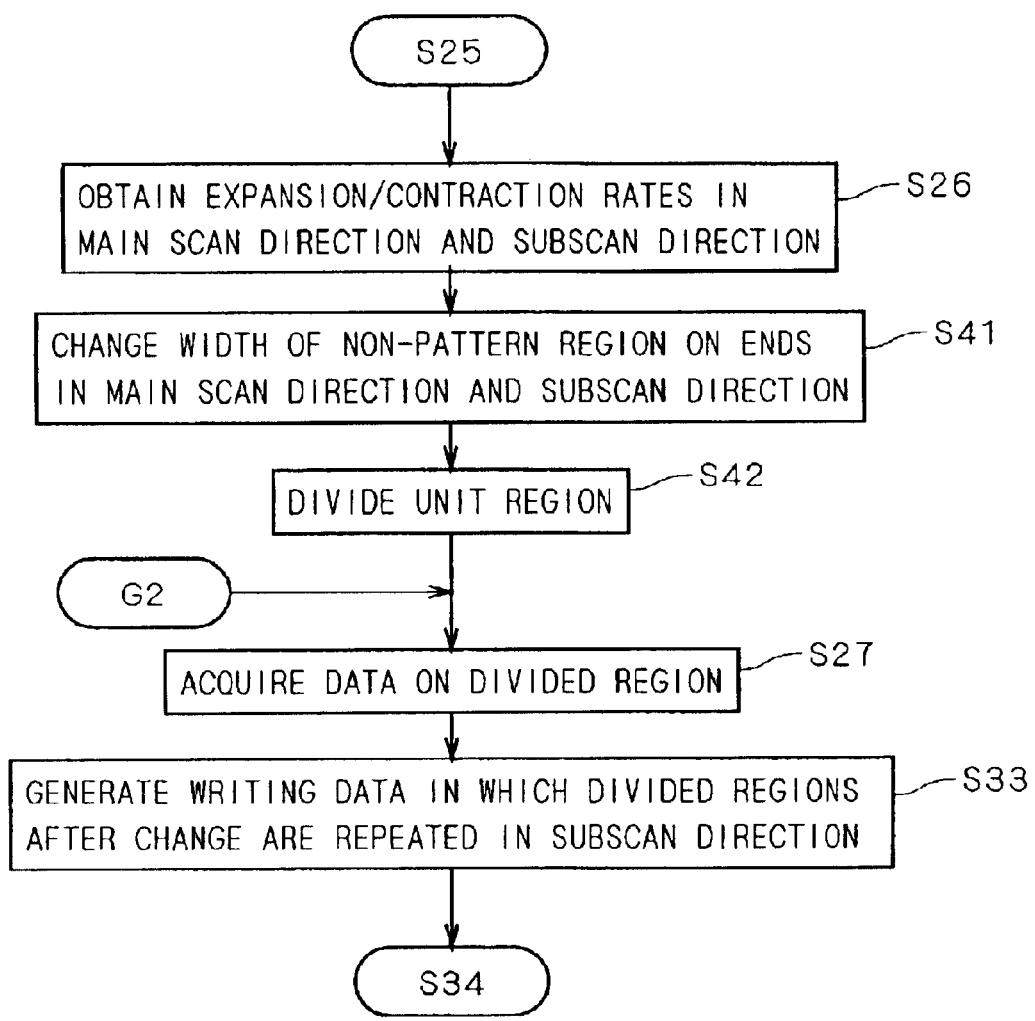
FIG. 14 is a flowchart showing another operation of the pattern writing apparatus.

FIG. 14 is a flowchart showing another operation of the pattern writing apparatus 1. The constitution (structure) of the pattern writing apparatus 1 is the same as shown in FIGS. 1, 2 and 5. FIG. 14 shows an exemplary operation in a case where the rasterization part 312 rasterizes the whole LSI data 931 in advance and the rasterized data is stored in the memory 311 as raster data 932. The pattern writing apparatus 1 performs the same operation in this flow as in the flow of FIGS. 7 and 8 except that Steps S41 and S42 are additionally inserted between Steps S26 and S27 of FIG. 7 and Steps S31 and S32 of FIG. 8 are omitted.

Figure 15:
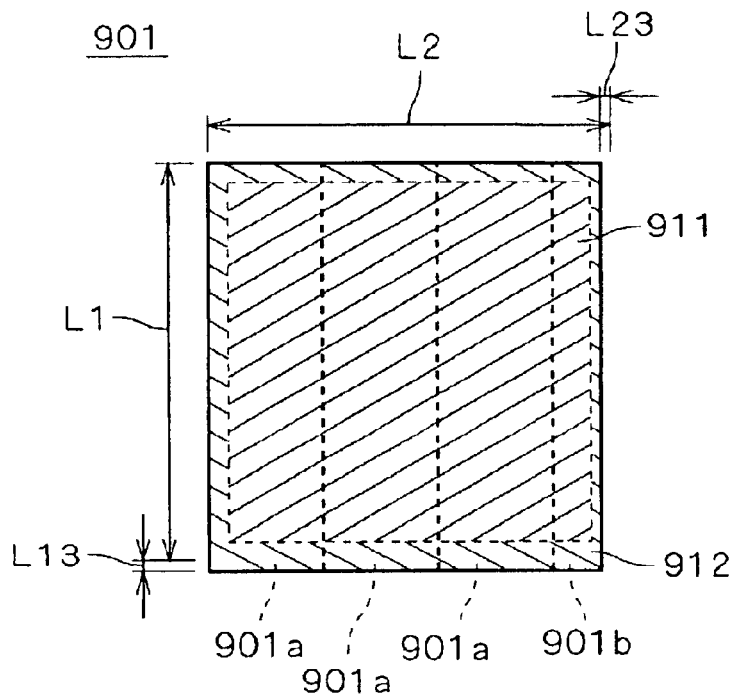
FIG. 15 is a view used for explanation of another exemplary data correction.

When the expansion/contraction rates of the substrate 9 in the main scan direction and the subscan direction are obtained in the pattern writing apparatus 1 (Step S26), the data correction part 314 performs data correction on the whole unit region 901 for changing the widths of the non-pattern region 912 in the main scan and subscan directions while maintaining the shape of the pattern 911 as shown in FIG. 15 (Step S41). FIG. 15 shows a case where the width L1 in the subscan direction increases by ΔL13 and the width L2 in the main scan direction decreases by ΔL23.

The data correction part 314 performs division of the changed unit region 901 in accordance with the scan width of the light beam in the direction of main scan by the polygon mirror 27 (Step S42). With this operation, raster data corresponding to the divided regions 901a and 901b of FIG. 9 are generated. After that, by repeating generation of writing data for each stripe (Steps S27 and S33) and writing for each stripe (FIG. 8: Step S34), writing on the whole main surface of the substrate 9 is performed.

In the operation of FIG. 14, since rasterization is performed on each unit region 901, the rasterization is not constrained by the width of main scan by the irradiation head 15 and it therefore becomes easy to separately prepare the raster data 932 through the processing by the general computer 31.

Figure 16:
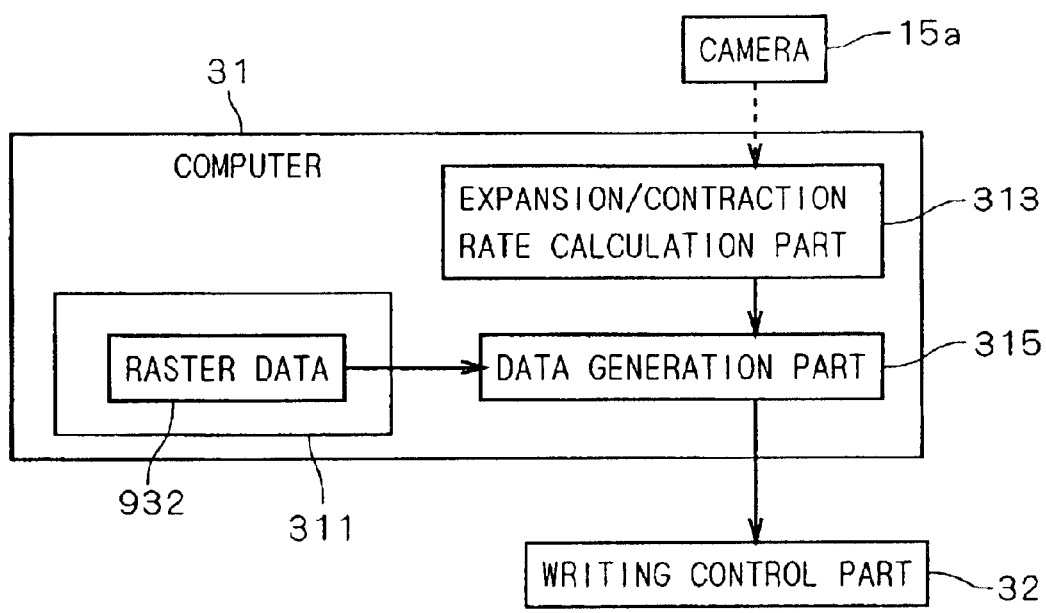
FIG. 16 is a block diagram showing another functional constitution in a computer.

FIG. 16 is a block diagram showing another functional constitution inside the computer 31. FIG. 16 shows a constitution in which the data correction part 314 is omitted from the constitution of FIG. 5, and in this figure, the rasterization part 312 or the like is not shown. As the raster data 932, data on the unit region 901a after division is prepared like in FIG. 4.

In the data generation part 315 of FIG. 16, the raster data 932 is not corrected and data used for control by the writing control part 32 on emission of light beam from the irradiation head 15 and transfer of the stage 14 is generated, by which writing is performed with the widths of each non-pattern region 912 in the main scan and subscan directions changed and the size of each pattern block 911 not changed.

Specifically, when the substrate 9 expands in the subscan direction, the stage 14 is vacantly transferred every time when writing on one divided region 901a (or divided region 901b) is completed, and the irradiation point of the light beam is shifted to the writing start position of the next divided region. The width of a gap between adjacent pattern blocks is thereby increased while the width of the pattern block 911 is maintained in the subscan direction. On the other hand, when the substrate 9 contracts in the subscan direction, before writing on one divided region is completed, the processing goes to writing of the next divided region, and the width of the gap between adjacent pattern blocks is decreased while the width of the pattern block 911 is maintained in the subscan direction.

When writing on the stripe 921 corresponding to the divided region 901b is completed, transfer of the irradiation head 15 is controlled in accordance with expansion or contraction of the substrate 9 in the main scan direction and the writing start position of the next stripe 921 is controlled in the main scan direction. As a result, the width of a gap between the pattern blocks is increased or decreased while the width of the pattern block 911 is maintained also in the main scan direction.

Thus, it is possible to mechanically change the widths of each gap between the pattern blocks 911 in the main scan and subscan directions, and such a method also allows an appropriate writing on the substrate 9.

Though the preferred embodiment of the present invention has been discussed above, the present invention is not limited to the above-discussed preferred embodiment, but allows various variations.

The light beam is not limited to a multichannel beam but may be a single beam. As the light source of a light beam, others than a gas laser or a semiconductor laser may be used, and for example, a lamp, a light emitting diode and the like may be used. The main scan of the light beam may be performed by using a galvanometer mirror or transferring the irradiation head 15.

While the writing data is generated by the computer 31 in the above-discussed preferred embodiment, all or part of the functions shown in FIG. 5 may be achieved by dedicated electric circuits.

Measurement of expansion or contraction of the substrate 9 may be performed by other methods, and for example, a noncontact measurement with another light beam which is separately emitted may be performed. The measurement on the substrate 9 may be performed in some places other than on the stage 14.

While the widths of each non-pattern region 912 in the unit region 901 in the main scan direction and the subscan direction are changed in the above-discussed preferred embodiment, there may be a case where the width of the pattern block 911 is maintained in either the main scan direction or the subscan direction and the width thereof in the other direction is expanded or contracted through control of the main scan or the subscan. In the constitution of the pattern writing apparatus 1, particularly, it is possible to appropriately perform expansion or contraction in series in the main scan direction by controlling the operation of the polygon mirror 27 and the modulation of the light beam.

While correction is performed on the raster data 932 in the above-discussed preferred embodiment, correction may be performed on the LSI data 931. In other words, only if the widths of each non-pattern region 912 in the main scan and subscan directions can be substantially changed, the method of data correction may be changed as appropriate.

The array of the pattern blocks 911 is not limited to the lattice (i.e., matrix) arrangement, but an array may be used in which the pattern blocks are aligned in the subscan direction and not aligned in the main scan direction.

The pattern writing apparatus 1, which is suitable for pattern writing with a light beam on a semiconductor substrate, may be also used on other substrates, such as a printed circuit board, on which a plurality of pattern blocks 911 are written.

While the invention has been shown and described in detail, the foregoing description is in all aspects illustrative and not restrictive. It is therefore understood that numerous modifications and variations can be devised without departing from the scope of the invention.

What is claimed is:

1. A pattern writing apparatus for performing pattern writing by irradiating a substrate with a light beam, comprising:
    a light beam emission part for emitting a modulated light beam;
    a scanning mechanism for scanning an irradiation point of a light beam from said light beam emission part on a substrate;
    a writing data generation part for generating writing data;
    a writing control part for writing an array of a plurality of pattern blocks on a substrate by controlling said light beam emission part and said scanning mechanism on the basis of writing data; and
    a detector for detecting expansion or contraction of a substrate,
    wherein said writing data generation part generates writing data in which a width of each gap between adjacent ones of pattern blocks is changed on the basis of a detection result from said detector while a width of each of said plurality of pattern blocks is maintained in at least one direction.

2. The pattern writing apparatus according to claim 1, wherein
    said writing data generation part generates writing data in which widths of each gap between adjacent ones of pattern blocks are changed while widths of each of said plurality of pattern blocks are maintained in two directions orthogonal to each other.

3. The pattern writing apparatus according to claim 2, wherein
    said scanning mechanism scans an irradiation point of a light beam in a main scan direction and a subscan direction and writing of stripe regions each extending in said subscan direction is repeated in said main scan direction,
    each unit region includes one of said plurality of pattern blocks, and
    every edge on an end in said main scan direction of said each unit region coincides with an edge of one of said stripe regions.

4. The pattern writing apparatus according to claim 3, wherein
    said writing data generation part divides said each unit region into a plurality of divided regions each having a predetermined width in said main scan direction to obtain partial writing data on each of said plurality of divided regions.

5. The pattern writing apparatus according to claim 4, wherein
    said writing data generation part corrects said partial writing data to data in which a width of a non-pattern region on an end in said subscan direction is changed on the basis of said detection result.

6. The pattern writing apparatus according to claim 4, wherein
    said writing data generation part corrects partial writing data corresponding to a divided region on an end in said main scan direction to data in which a width of a non-pattern region on an end in said main scan direction is changed on the basis of said detection result.

7. The pattern writing apparatus according to claim 1, wherein
    said writing data generation part generates said writing data by substantially changing a width of a non-pattern region of each unit region including one of said plurality of pattern blocks on the basis of said detection result.

8. The pattern writing apparatus according to claim 1, wherein
    each of said plurality of pattern blocks corresponds to one chip which is written on a semiconductor substrate.

9. A pattern writing method for performing pattern writing by irradiating a substrate with a light beam, comprising the steps of:
    preparing image data including a pattern block to be written on a substrate;
    acquiring a detection result of expansion or contraction of said substrate;
    generating writing data corresponding to a plurality of pattern blocks which are arrayed; and
    writing said plurality of pattern blocks on said substrate by emitting a modulated light beam while scanning an irradiation point on said substrate on the basis of said writing data,
    wherein writing data in which a width of each gap between adjacent ones of pattern blocks is changed on the basis of said detection result while a width of each of said plurality of pattern blocks is maintained in at least one direction is generated in said step of generating writing data.

10. The pattern writing method according to claim 9, wherein
    writing data in which widths of each gap between adjacent ones of pattern blocks are changed while widths of each of said plurality of pattern blocks are maintained in two directions orthogonal to each other is generated in said step of generating writing data.

11. The pattern writing method according to claim 10, wherein
    an irradiation point of said light beam is scanned in a main scan direction and a subscan direction and writing of stripe regions each extending in said subscan direction is repeated in said main scan direction in said step of writing,
    each unit region includes one of said plurality of pattern blocks, and every edge on an end in said main scan direction of said each unit region coincides with an edge of one of said stripe regions.

12. The pattern writing method according to claim 11, wherein said step of generating writing data comprises the steps of:

dividing said each unit region into a plurality of divided regions each having a predetermined width in said main scan direction to obtain partial writing data on each of said plurality of divided regions.

13. The pattern writing method according to claim 12, wherein said step of generating writing data comprises the step of correcting said partial writing data to data in which a width of a non-pattern region on an end in said subscan direction is changed on the basis of said detection result.

14. The pattern writing method according to claim 12, wherein said step of generating writing data comprises the step of correcting partial writing data corresponding to a divided region on an end in said main scan direction to data in which a width of a non-pattern region on an end in said main scan direction is changed on the basis of said detection result.

15. The pattern writing method according to claim 9, wherein said writing data is generated by substantially changing a width of a non-pattern region of each unit region including one of said plurality of pattern blocks on the basis of said detection result in said step of generating writing data.

16. The pattern writing method according to claim 9, wherein each of said plurality of pattern blocks corresponds to one chip which is written on a semiconductor substrate.

17. A substrate on which a pattern is written by emitting a modulated light beam thereto while scanning said light beam, comprising:

a plurality of pattern blocks arrayed on a main surface; and non-pattern regions each between adjacent ones of said plurality of pattern blocks, wherein a width of each gap between adjacent ones of said pattern blocks is changed in accordance with expansion or contraction of said main surface while a width of each of said pattern blocks is maintained in at least one direction.

18. The substrate according to claim 17, wherein widths of each gap between adjacent ones of said pattern blocks are changed in accordance with expansion or contraction of said main surface while widths of each of said plurality of pattern blocks are maintained in two directions orthogonal to each other where said plurality of pattern blocks are arrayed.

* * * * *